United States Patent
Pettis et al.

(10) Patent No.: US 10,005,226 B2
(45) Date of Patent: *Jun. 26, 2018

(54) DOWNLOADABLE THREE-DIMENSIONAL MODELS

(71) Applicant: MakerBot Industries, LLC, Brooklyn, NY (US)

(72) Inventors: Nathaniel B. Pettis, Brooklyn, NY (US); Anthony James Buser, Linden, NJ (US); Justin Day, New York, NY (US); Jonah Gold, Brooklyn, NY (US); Bryan Vaccaro, South Orange, NJ (US); Joseph Neal, Riverside, CT (US)

(73) Assignee: MakerBot Industries, LLC, Brooklyn, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/844,744

(22) Filed: Dec. 18, 2017

(65) Prior Publication Data

US 2018/0104890 A1  Apr. 19, 2018

Related U.S. Application Data

(63) Continuation of application No. 13/914,448, filed on Jun. 10, 2013, now Pat. No. 9,844,914.

(60) Provisional application No. 61/657,241, filed on Jun. 8, 2012.

(51) Int. Cl.
*B29C 64/112* (2017.01)
*B33Y 30/00* (2015.01)
(Continued)

(52) U.S. Cl.
CPC ............ *B29C 64/112* (2017.08); *B29C 64/20* (2017.08); *B29C 64/386* (2017.08); *B33Y 30/00* (2014.12); *B33Y 40/00* (2014.12); *F16M 11/12* (2013.01); *F16M 11/18* (2013.01); *G05B 19/4099* (2013.01); *B33Y 50/00* (2014.12); *B33Y 50/02* (2014.12); *G05B 2219/35134* (2013.01); *G05B 2219/49007* (2013.01); *Y02P 90/265* (2015.11); *Y02T 10/82* (2013.01)

(58) Field of Classification Search
CPC .................................................. B29C 67/0088
See application file for complete search history.

(56) References Cited

U.S. PATENT DOCUMENTS 7,184,158 B2  2/2007  Shiozaki
7,375,835 B1  5/2008  Hull et al.
(Continued)

OTHER PUBLICATIONS

"3D FUNPOD", http://phlatboyz.blogspot.com/2012/02/3d-printed-micro-3d-3d-funpod-3d-funpod.html Feb. 8, 2012, pp. 1-3.
(Continued)

*Primary Examiner* — Ibrahim Siddo
(74) *Attorney, Agent, or Firm* — Strategic Patents, P.C.

(57) ABSTRACT

A server is configured to store a number of different models of an object in machine-ready form corresponding to a number of different three-dimensional printers having differing capabilities and/or hardware configurations. When a user at a client device or a printer requests the object, the server automatically determines a printer type and selects a suitable, corresponding machine-ready model for immediate fabrication by the printer.

19 Claims, 5 Drawing Sheets

(51) Int. Cl.
*B33Y 40/00* (2015.01)
*B29C 64/386* (2017.01)
*B29C 64/20* (2017.01)
*F16M 11/12* (2006.01)
*F16M 11/18* (2006.01)
*G05B 19/4099* (2006.01)
*B33Y 50/00* (2015.01)
*B33Y 50/02* (2015.01)

(56) References Cited

U.S. PATENT DOCUMENTS

| | | | |
|---|---|---|---|
| 8,412,588 B1 | 4/2013 | Bodell et al. | |
| 2002/0041386 A1 | 4/2002 | Suzuki et al. | |
| 2003/0105643 A1 | 6/2003 | Chen et al. | |
| 2005/0113962 A1 | 5/2005 | Matthews et al. | |
| 2008/0147817 A1 | 6/2008 | Horibe | |
| 2008/0232680 A1 | 9/2008 | Berestov et al. | |
| 2009/0201551 A1 | 8/2009 | Uchida | |
| 2012/0050478 A1 | 3/2012 | Karaoguz et al. | |
| 2012/0078845 A1 | 3/2012 | Kasbekar et al. | |
| 2012/0185409 A1 | 7/2012 | Coleman et al. | |
| 2012/0224755 A1* | 9/2012 | Wu | G06T 17/00 382/131 |
| 2012/0281013 A1 | 11/2012 | Mahdavi et al. | |
| 2013/0329243 A1 | 12/2013 | Pettis et al. | |
| 2013/0329257 A1 | 12/2013 | Pettis et al. | |
| 2013/0329258 A1 | 12/2013 | Pettis et al. | |
| 2014/0156053 A1* | 6/2014 | Mahdavi | B29C 67/0059 700/119 |

OTHER PUBLICATIONS

"Ultra-Bot 3D Printer, William Steele", http://www.kickstarter.com/projects/wjsteele/ultra-bot-3d-printer/posts/362119NPL-20 Dec. 4, 2012, pp. 1-17.

USPTO, "U.S. Appl. No. 13/914,448, Non-Final Office Action dated Jan. 6, 2017", 18 pages.
USPTO, "U.S. Appl. No. 13/914,448, Notice of Allowance dated Aug. 10, 2017", 14 pages.
USPTO, "U.S. Appl. No. 13/914,448 Final Office Action dated Feb. 10, 2015", NPL-116, 20 pages.
USPTO, "U.S. Appl. No. 13/914,448 Non-Final Office Action dated Mar. 21, 2016", 39 pages.
USPTO, "U.S. Appl. No. 13/914,448, Final Office Action dated Jul. 22, 2016", 35 Pages.
USPTO, "U.S. Appl. No. 13/921,544 Final Office Action dated Feb. 10, 2015", 27 pages.
USPTO, "U.S. Appl. No. 13/921,544 Non-Final Office Action dated Mar. 21, 2016", 38 pages.
USPTO, "U.S. Appl. No. 13/914,448 Final Office Action dated Oct. 29, 2015", 37 pages.
USPTO, "U.S. Appl. No. 13/914,448 Non-Final Office Action dated Jun. 11, 2015", 33 pages.
"U.S. Appl. No. 13/914,448 Non-Final Office Action dated Oct. 15, 2014", 20 pages.
USPTO, "U.S. Appl. No. 13/921,351 Final Office Action dated Feb. 24, 2015", 26 pages.
USPTO, "U.S. Appl. No. 13/921,351 Final Office Action dated Nov. 9, 2015", 33 pages.
USPTO, "U.S. Appl. No. 13/921,351 Non-Final Office Action dated Mar. 21, 2016", 36 pages.
USPTO, "U.S. Appl. No. 13/921,351 Non-Final Office Action dated Jun. 3, 2015", 30 pages.
"U.S. Appl. No. 13/921,351 Non-Final Office Action dated Nov. 25, 2014", 22 pages.
USPTO, "U.S. Appl. No. 13/921,544 Final Office Action dated Nov. 6, 2015", 38 pages.
USPTO, "U.S. Appl. No. 13/921,544 Non-Final Office Action dated Jun. 3, 2015", 34 pages.
"U.S. Appl. No. 13/921,544 Non-Final Office Action dated Dec. 29, 2014", 35 pages.

* cited by examiner

DOWNLOADABLE THREE-DIMENSIONAL MODELS

RELATED APPLICATIONS

This application is a continuation of U.S. patent application Ser. No. 13/914,448 filed on Jun. 10, 2013, which claims the benefit of U.S. Prov. Pat. App. No. 61/657,241 filed on Jun. 8, 2012, where the entire content of each of the foregoing is hereby incorporated by reference.

BACKGROUND

In general, computer representations of objects are shared in an abstract, descriptive form such as a computer-automated design (CAD) file or a stereolithography (STL) file. While these formats can provide a relatively compact and universal representation of a three-dimensional object, they generally require additional processing by a user in order to render machine-ready instructions for a three-dimensional printer. This process, sometimes referred to as "slicing" (in reference to the decomposition of the object into a sequence of two-dimensional slices) can be very processing intensive, and often requires user selection of a variety of parameters relating to layer thickness, infilling density, tool temperature, tool speeds, and so forth. Parameter optimization will depend in part of the type of three-dimensional printer being used. Further complicating this process, certain features of objects will generally render better using certain slicing parameters, and a successful print may require significant user experimentation. These challenges are exacerbated by the proliferation of three-dimensional printers and the increasing number of users with divergent hardware who are seeking printable content online.

There remains a need for tools that improve network access to printable content by users of three-dimensional printers.

SUMMARY

A server is configured to store a number of different models of an object in machine-ready form corresponding to a number of different three-dimensional printers having differing capabilities and/or hardware configurations. When a user at a client device or a printer requests the object, the server automatically determines a printer type and selects a suitable, corresponding machine-ready model for immediate fabrication by the printer.

BRIEF DESCRIPTION OF THE FIGURES

The invention and the following detailed description of certain embodiments thereof may be understood by reference to the following figures.

DETAILED DESCRIPTION

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Thus the term "or" should generally be understood to mean "and/or" and so forth.

The following description emphasizes three-dimensional printers using fused deposition modeling or similar techniques where a bead of material is extruded in a layered series of two dimensional patterns as "roads," "paths" or the like to form a three-dimensional object from a digital model. It will be understood, however, that numerous additive fabrication techniques are known in the art including without limitation multijet printing, stereolithography, Digital Light Processor ("DLP") three-dimensional printing, selective laser sintering, and so forth. Such techniques may benefit from the systems and methods described below, and all such printing technologies are intended to fall within the scope of this disclosure, and within the scope of terms such as "printer", "three-dimensional printer", "fabrication system", and so forth, unless a more specific meaning is explicitly provided or otherwise clear from the context.

Figure 1:
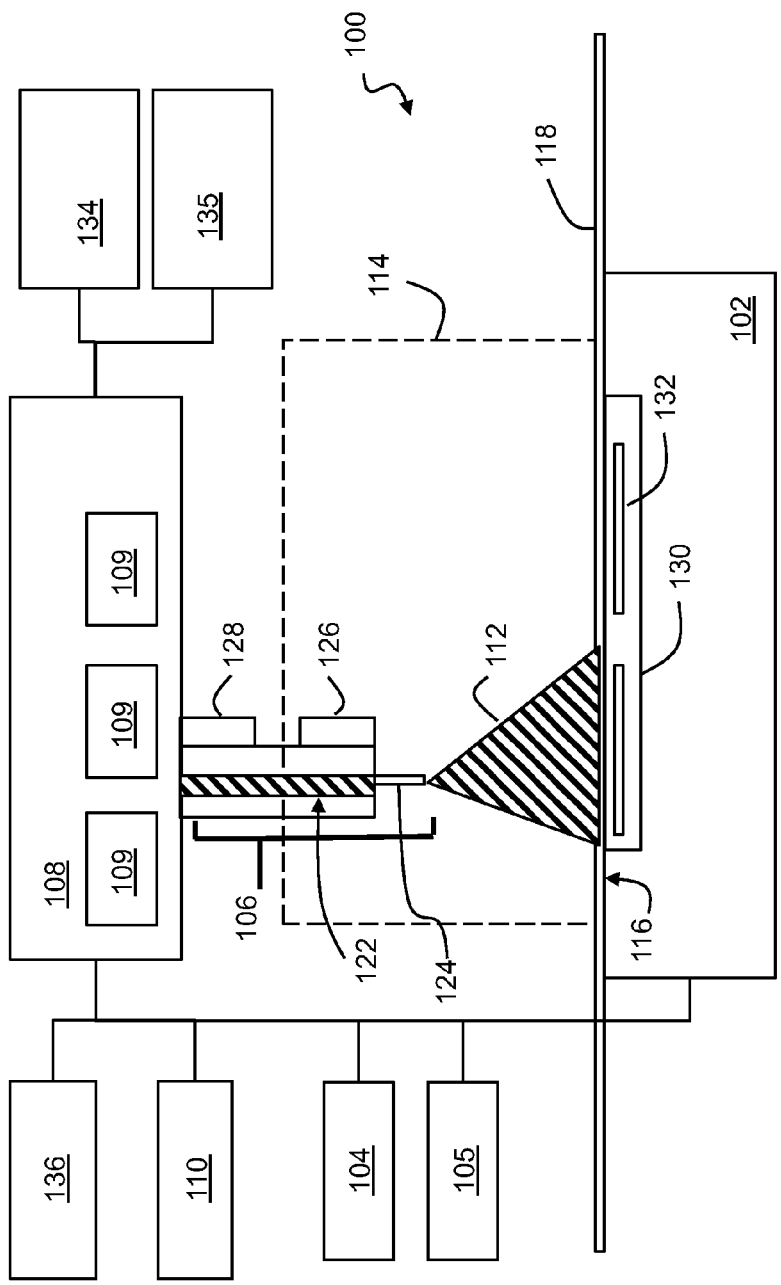
FIG. 1 is a block diagram of a three-dimensional printer.

FIG. 1 is a block diagram of a three-dimensional printer. In general, the printer 100 may include a build platform 102, an extruder 106, an x-y-z positioning assembly 108, and a controller 110 that cooperate to fabricate an object 112 within a working volume 114 of the printer 100.

The build platform 102 may include a surface 116 that is rigid and substantially planar. The surface 116 may provide a fixed, dimensionally and positionally stable platform on which to build the object 112. The build platform 102 may include a thermal element 130 that controls the temperature of the build platform 102 through one or more active devices 132, such as resistive elements that convert electrical current into heat, Peltier effect devices that can create a heating or cooling affect, or any other thermoelectric heating and/or cooling devices. The thermal element 130 may be coupled in a communicating relationship with the controller 110 in order for the controller 110 to controllably impart heat to or remove heat from the surface 116 of the build platform 102.

The extruder 106 may include a chamber 122 in an interior thereof to receive a build material. The build material may, for example, include acrylonitrile butadiene styrene ("ABS"), high-density polyethylene ("HDPL"), polylactic acid ("PLA"), or any other suitable plastic, thermoplastic, or other material that can usefully be extruded to form a three-dimensional object. The extruder 106 may include an extrusion tip 124 or other opening that includes an exit port with a circular, oval, slotted or other cross-sectional profile that extrudes build material in a desired cross-sectional shape.

The extruder 106 may include a heater 126 (also referred to as a heating element) to melt thermoplastic or other meltable build materials within the chamber 122 for extrusion through an extrusion tip 124 in liquid form. While illustrated in block form, it will be understood that the heater 126 may include, e.g., coils of resistive wire wrapped about the extruder 106, one or more heating blocks with resistive elements to heat the extruder 106 with applied current, an inductive heater, or any other arrangement of heating elements suitable for creating heat within the chamber 122 sufficient to melt the build material for extrusion. The extruder 106 may also or instead include a motor 128 or the like to push the build material into the chamber 122 and/or through the extrusion tip 124.

In general operation (and by way of example rather than limitation), a build material such as ABS plastic in filament form may be fed into the chamber 122 from a spool or the like by the motor 128, melted by the heater 126, and extruded from the extrusion tip 124. By controlling a rate of the motor 128, the temperature of the heater 126, and/or other process parameters, the build material may be extruded at a controlled volumetric rate. It will be understood that a variety of techniques may also or instead be employed to deliver build material at a controlled volumetric rate, which may depend upon the type of build material, the volumetric rate desired, and any other factors. All such techniques that might be suitably adapted to delivery of build material for fabrication of a three-dimensional object are intended to fall within the scope of this disclosure.

The x-y-z positioning assembly 108 may generally be adapted to three-dimensionally position the extruder 106 and the extrusion tip 124 within the working volume 114. Thus by controlling the volumetric rate of delivery for the build material and the x, y, z position of the extrusion tip 124, the object 112 may be fabricated in three dimensions by depositing successive layers of material in two-dimensional patterns derived, for example, from cross-sections of a computer model or other computerized representation of the object 112. A variety of arrangements and techniques are known in the art to achieve controlled linear movement along one or more axes. The x-y-z positioning assembly 108 may, for example, include a number of stepper motors 109 to independently control a position of the extruder 106 within the working volume along each of an x-axis, a y-axis, and a z-axis. More generally, the x-y-z positioning assembly 108 may include without limitation various combinations of stepper motors, encoded DC motors, gears, belts, pulleys, worm gears, threads, and so forth. For example, in one aspect the build platform 102 may be coupled to one or more threaded rods by a threaded nut so that the threaded rods can be rotated to provide z-axis positioning of the build platform 102 relative to the extruder 106. This arrangement may advantageously simplify design and improve accuracy by permitting an x-y positioning mechanism for the extruder 106 to be fixed relative to a build volume. Any such arrangement suitable for controllably positioning the extruder 106 within the working volume 114 may be adapted to use with the printer 100 described herein.

In general, this may include moving the extruder 106, or moving the build platform 102, or some combination of these. Thus it will be appreciated that any reference to moving an extruder relative to a build platform, working volume, or object, is intended to include movement of the extruder or movement of the build platform, or both, unless a more specific meaning is explicitly provided or otherwise clear from the context. Still more generally, while an x, y, z coordinate system serves as a convenient basis for positioning within three dimensions, any other coordinate system or combination of coordinate systems may also or instead be employed, such as a positional controller and assembly that operates according to cylindrical or spherical coordinates.

The controller 110 may be electrically or otherwise coupled in a communicating relationship with the build platform 102, the x-y-z positioning assembly 108, and the other various components of the printer 100. In general, the controller 110 is operable to control the components of the printer 100, such as the build platform 102, the x-y-z positioning assembly 108, and any other components of the printer 100 described herein to fabricate the object 112 from the build material. The controller 110 may include any combination of software and/or processing circuitry suitable for controlling the various components of the printer 100 described herein including without limitation microprocessors, microcontrollers, application-specific integrated circuits, programmable gate arrays, and any other digital and/or analog components, as well as combinations of the foregoing, along with inputs and outputs for transceiving control signals, drive signals, power signals, sensor signals, and so forth. In one aspect, this may include circuitry directly and physically associated with the printer 100 such as an on-board processor. In another aspect, this may be a processor associated with a personal computer or other computing device coupled to the printer 100, e.g., through a wired or wireless connection. Similarly, various functions described herein may be allocated between an on-board processor for the printer 100 and a separate computer. All such computing devices and environments are intended to fall within the meaning of the term "controller" or "processor" as used herein, unless a different meaning is explicitly provided or otherwise clear from the context.

A variety of additional sensors and other components may be usefully incorporated into the printer 100 described above. These other components are generically depicted as other hardware 134 in FIG. 1, for which the positioning and mechanical/electrical interconnections with other elements of the printer 100 will be readily understood and appreciated by one of ordinary skill in the art. The other hardware 134 may include a temperature sensor positioned to sense a temperature of the surface of the build platform 102, the extruder 126, or any other system components. This may, for example, include a thermistor or the like embedded within or attached below the surface of the build platform 102. This may also or instead include an infrared detector or the like directed at the surface 116 of the build platform 102.

In another aspect, the other hardware 134 may include a sensor to detect a presence of the object 112 at a predetermined location. This may include an optical detector arranged in a beam-breaking configuration to sense the presence of the object 112 at a predetermined location. This may also or instead include an imaging device and image processing circuitry to capture an image of the working volume and to analyze the image to evaluate a position of the object 112. This sensor may be used for example to ensure that the object 112 is removed from the build platform 102 prior to beginning a new build on the working surface 116. Thus the sensor may be used to determine whether an object is present that should not be, or to detect when an object is absent. The feedback from this sensor may be used by the controller 110 to issue processing interrupts or otherwise control operation of the printer 100.

The other hardware 134 may also or instead include a heating element (instead of or in addition to the thermal element 130) to heat the working volume such as a radiant heater or forced hot air heater to maintain the object 112 at a fixed, elevated temperature throughout a build, or the other hardware 134 may include a cooling element to cool the working volume.

Figure 2:
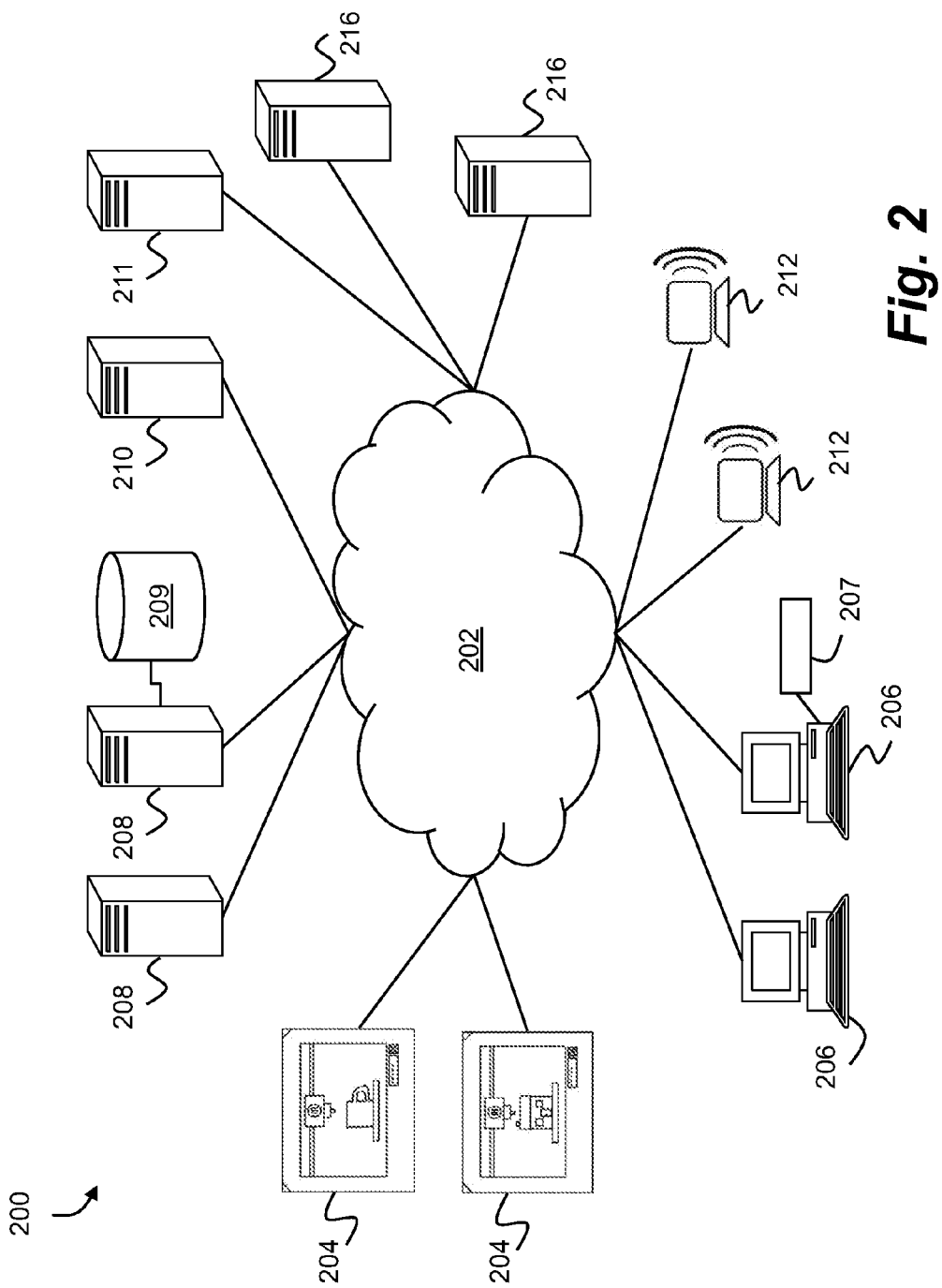
FIG. 2 depicts a networked three-dimensional printing environment.

FIG. 2 depicts a networked three-dimensional printing environment. In general, the environment 200 may include a data network 202 interconnecting a plurality of participating devices in a communicating relationship. The participating devices may, for example, include any number of three-dimensional printers 204 (also referred to interchangeably herein as "printers"), client devices 206, print servers 208, content sources 210, mobile devices 212, and other resources 216.

The data network 202 may be any network(s) or inter-network(s) suitable for communicating data and control information among participants in the environment 200. This may include public networks such as the Internet, private networks, telecommunications networks such as the Public Switched Telephone Network or cellular networks using third generation (e.g., 3G or IMT-2000), fourth generation (e.g., LTE (E-UTRA) or WiMax-Advanced (IEEE 802.16m)) and/or other technologies, as well as any of a variety of corporate area or local area networks and other switches, routers, hubs, gateways, and the like that might be used to carry data among participants in the environment 200.

The three-dimensional printers 204 may be any computer-controlled devices for three-dimensional fabrication, including without limitation any of the three-dimensional printers or other fabrication or prototyping devices described above. In general, each such device may include a network interface comprising, e.g., a network interface card, which term is used broadly herein to include any hardware (along with software, firmware, or the like to control operation of same) suitable for establishing and maintaining wired and/or wireless communications. The network interface card may include without limitation wired Ethernet network interface cards ("NICs"), wireless 802.11 networking cards, wireless 802.11 USB devices, or other hardware for wireless local area networking. The network interface may also or instead include cellular network hardware, wide area wireless network hardware or any other hardware for centralized, ad hoc, peer-to-peer, or other radio communications that might be used to carry data. In another aspect, the network interface may include a serial or USB port to directly connect to a computing device such as a desktop computer that, in turn, provides more general network connectivity to the data network 202.

The printers 204 might be made to fabricate any object, practical or otherwise, that is amenable to fabrication according to each printer's capabilities. This may be a model of a house or a tea cup, as depicted, or any other object such as gears or other machine hardware, replications of scanned three-dimensional objects, or fanciful works of art.

Client devices 206 may be any devices within the environment 200 operated by users to initiate, manage, monitor, or otherwise interact with print jobs at the three-dimensional printers 204. This may include desktop computers, laptop computers, network computers, tablets, or any other computing device that can participate in the environment 200 as contemplated herein. Each client device 206 generally provides a user interface, which may include a graphical user interface, a text or command line interface, a voice-controlled interface, and/or a gesture-based interface to control operation of remote three-dimensional printers 204. The user interface may be maintained by a locally executing application on one of the client devices 206 that receives data and status information from, e.g., the printers 204 and print servers 208 concerning pending or executing print jobs. The user interface may create a suitable display on the client device 206 for user interaction. In other embodiments, the user interface may be remotely served and presented on one of the client devices 206, such as where a print server 208 or one of the three-dimensional printers 204 includes a web server that provides information through one or more web pages or the like that can be displayed within a web browser or similar client executing on one of the client devices 206. In one aspect, the user interface may include a voice controlled interface that receives spoken commands from a user and/or provides spoken feedback to the user.

A client device 206 may, for example include a removable memory device 207 such as a USB drive, memory stick, or the like, which may be used for example to transfer digital models of three-dimensional objects to printers 204.

The print servers 208 may include data storage, a network interface, and a processor and/or other processing circuitry. In the following description, where the functions or configuration of a print server 208 are described, this is intended to include corresponding functions or configuration (e.g., by programming) of a processor of the print server 208. In general, the print servers 208 (or processors thereof) may perform a variety of processing tasks related to management of networked printing. For example, the print servers 208 may manage print jobs received from one or more of the client devices 206, and provide related supporting functions such as content search and management. A print server 208 may also include a web server that provides web-based access by the client devices 206 to the capabilities of the print server 208. A print server 208 may also communicate periodically with three-dimensional printers 204 in order to obtain status information concerning, e.g., availability of printers and/or the status of particular print jobs, any of which may be subsequently presented to a user through the web server or any other suitable interface. A print server 208 may also maintain a list of available three-dimensional printers 204, and may automatically select one of the three-dimensional printers 204 for a user-submitted print job, or may permit a user to specify a single printer, or a group of preferred printers, for fabricating an object. Where the print server 208 selects the printer automatically, any number of criteria may be used such as geographical proximity, printing capabilities, current print queue, fees (if any) for use of a particular three-dimensional printer 204, and so forth. Where the user specifies criteria, this may similarly include any relevant aspects of three-dimensional printers 204, and may permit use of absolute criteria (e.g., filters) or preferences, which may be weighted preferences or unweighted preferences, any of which may be used by a print server 208 to allocate a print job to a suitable resource.

In one aspect, the print server 208 may be configured to support interactive voice control of one of the printers 204. For example, the print server 208 may be configured to receive a voice signal (e.g., in digitized audio form) from a microphone or other audio input of the printer 204, and to process the voice signal to extract relevant content such as a command for the printer. Where the command is recognized as a print command, the voice signal may be further processed to extract additional context or relevant details. For example, the voice signal may be processed to extract an object identifier that specifies an object for printing, e.g., by filename, file metadata, or semantic content. The voice signal may also be processed to extract a dimensional specification, such as a scale or absolute dimension for an object. The print server 208 may then generate suitable control signals for return to the printer 204 to cause the printer 204 to fabricate the object. Where an error or omission is detected, the print server 208 may return a request for clarification to the printer 204, which may render the request in spoken form through a speaker, or within a user interface of the printer 204 or an associated device.

Other user preferences may be usefully stored at the print server 208 to facilitate autonomous, unsupervised fabrication of content from content sources 210. For example, a print server 208 may store a user's preference on handling objects greater than a build volume of a printer. These preferences may control whether to resize the object, whether to break the object into multiple sub-objects for fabrication, and whether to transmit multiple sub-objects to a single printer or multiple printers. In addition, user preferences or requirements may be stored, such as multi-color printing capability, build material options and capabilities, and so forth. More generally, a print queue (which may be a printer-specific or user-specific queue, and which may be hosted at a printer 204, a server 208, or some combination of these) may be managed by a print server 208 according to one or more criteria from a remote user requesting a print job. The print server 208 may also store user preferences or criteria for filtering content, e.g., for automatic printing or other handling. While this is described below as a feature for autonomous operation of a printer (such as a printer that locally subscribes to a syndicated model source), any criteria that can be used to identify models of potential interest by explicit type (e.g., labeled in model metadata), implicit type (e.g., determined based on analysis of the model), source, and so forth, may be provided to the print server 208 and used to automatically direct new content to one or more user-specified ones of the three-dimensional printers 204.

In one aspect, the processor of the print server may be configured to store a plurality of print jobs submitted to the web server in a log and to provide an analysis of print activity based on the log. This may include any type of analysis that might be useful to participants in the environment 200. For example, the analysis may include tracking of the popularity of particular objects, or of particular content sources. The analysis may include tracking of which three-dimensional printers 204 are most popular or least popular, or related statistics such as the average backlog of pending print jobs at a number of the three-dimensional printers 204. The analysis may include success of a particular printer in fabricating a particular model, or of a particular printer in completing print jobs generally. More generally, any statistics or data may be obtained, and any analysis may be performed, that might be useful to users (e.g., when requesting prints), content sources (e.g., when choosing new printable objects for publication), providers of fabrication resources (e.g., when setting fees), or network facilitators such as the print servers 208.

A print server 208 may also maintain a database 209 of content, along with an interface for users at client devices 206 to search the database 209 and request fabrication of objects in the database 209 using any of the three-dimensional printers 204. Thus in one aspect, a print server 208 (or any system including the print server 208) may include a database 209 of three-dimensional models, and the print server 208 may act as a server that provides a search engine for locating a particular three-dimensional model in the database 209. The search engine may be a text-based search engine using keyword text queries, plain language queries, and so forth. The search engine may also or instead include an image-based search engine configured to identify three-dimensional models similar to a two-dimensional or three-dimensional image provide by a user.

In another aspect, the printer server 208 may periodically search for suitable content at remote locations on the data network, which content may be retrieved to the database 209, or have its remote location (e.g., a URL or other network location identifier) stored in the database 209. In another aspect, the print server 208 may provide an interface for submission of objects from remote users, along with any suitable metadata such as a title, tags, creator information, descriptive narrative, pictures, recommended printer settings, and so forth. In one aspect, the database 209 may be manually curated according to any desired standards. In another aspect, printable objects in the database 209 may be manually or automatically annotated according to content type, popularity, editorial commentary, and so forth.

The print server 208 may more generally provide a variety of management functions. For example, the print server 204 may store a location of a predetermined alternative three-dimensional printer to execute a print job from a remote user in the event of a failure by the one of the plurality of three-dimensional printers 204. In another aspect, the print server 208 may maintain exclusive control over at least one of the plurality of three-dimensional printers 204, such that other users and/or print servers cannot control the printer. In another aspect, the print server 208 may submit a print job to a first available one of the plurality of three-dimensional printers 204.

In another aspect, a print server 208 may provide an interface for managing subscriptions to sources of content. This may include tools for searching existing subscriptions, locating or specifying new sources, subscribing to sources of content, and so forth. In one aspect, a print server 208 may manage subscriptions and automatically direct new content from these subscriptions to a three-dimensional printer 204 according to any user-specified criteria. Thus while it is contemplated that a three-dimensional printer 204 may autonomously subscribe to sources of content through a network interface and receive new content directly from such sources, it is also contemplated that this feature may be maintained through a remote resource such as a print server 208.

A print server 208 may maintain print queues for participating three-dimensional printers 204. This approach may advantageously alleviate backlogs at individual printers 204, which may have limited memory capacity for pending print jobs. More generally, a print server 208 may, by communicating with multiple three-dimensional printers 204, obtain a view of utilization of multiple networked resources that permits a more efficient allocation of print jobs than would be possible through simple point-to-point communications among users and printers. Print queues may also be published by a print server 208 so that users can view pending queues for a variety of different three-dimensional printers 204 prior to selecting a resource for a print job. In one aspect, the print queue may be published as a number of print jobs and size of print jobs so that a requester can evaluate likely delays. In another aspect, the print queue may be published as an estimated time until a newly submitted print job can be initiated.

In one aspect, the print queue of one of the print servers 208 may include one or more print jobs for one of the plurality of three-dimensional printers 204. The print queue may be stored locally at the one of the plurality of three-dimensional printers. In another aspect, the print queue may be allocated between the database 209 and a local memory of the three-dimensional printer 204. In another aspect, the print queue may be stored, for example, in the database 209 of the print server 208. As used here, the term 'print queue' is intended to include print data (e.g., the three-dimensional model or tool instructions to fabricate an object) for a number of print job (which may be arranged for presentation in order of expected execution), as well as any metadata concerning print jobs. Thus, a portion of the print queue such as the metadata (e.g., size, status, time to completion) may be usefully communicated to a print server 208 for sharing among users while another portion of the print queue such as the model data may be stored at a printer in preparation for execution of a print job.

Print queues may implement various user preferences on prioritization. For example, for a commercial enterprise, longer print jobs may be deferred for after normal hours of operation (e.g., after 5:00 p.m.), while shorter print jobs may be executed first if they can be completed before the end of a business day. In this manner, objects can be identified and fabricated from within the print queue in a manner that permits as many objects as possible to be fabricated before a predetermined closing time. Similarly, commercial providers of fabrication services may charge explicitly for prioritized fabrication, and implement this prioritization by prioritizing print queues in a corresponding fashion.

In another aspect, a print server 208 may provide a virtual workspace for a user. In this virtual workspace, a user may search local or remote databases of printable objects, save objects of interest (or links thereto), manage pending prints, specify preferences for receiving status updates (e.g., by electronic mail or SMS text), manage subscriptions to content, search for new subscription sources, and so forth. In one aspect, the virtual workspace may be, or may include, web-based design tools or a web-based design interface that permits a user to create and modify models. In one aspect, the virtual workspace may be deployed on the web, while permitting direct fabrication of a model developed within that environment on a user-specified one of the three-dimensional printers 204, thus enabling a web-based design environment that is directly coupled to one or more fabrication resources.

The content sources 210 may include any sources of content for fabrication with a three-dimensional printer 204. This may, for example, include databases of objects accessible through a web interface or application programming interface. This may also or instead include individual desktop computers or the like configured as a server for hosted access, or configured to operate as a peer in a peer-to-peer network. This may also or instead include content subscription services, which may be made available in an unrestricted fashion, or may be made available on a paid subscription basis, or on an authenticated basis based upon some other relationship (e.g., purchase of a related product or a ticket to an event). It will be readily appreciated that any number of content providers may serve as content sources 210 as contemplated herein. By way of non-limiting example, the content sources 210 may include destinations such as amusement parks, museums, theaters, performance venues, or the like, any of which may provide content related to users who purchase tickets. The content sources 210 may include manufacturers such as automobile, computer, consumer electronics, or home appliance manufacturers, any of which may provide content related to upgrades, maintenance, repair, or other support of existing products that have been purchased. The content sources 210 may include artists or other creative enterprises that sell various works of interest. The content sources 210 may include engineering or architectural firms that provide marketing or advertising pieces to existing or prospective customers. The content sources 210 may include marketing or advertising firms that provide promotional items for clients. More generally, the content sources 210 may be any individual or enterprise that provides single or serial objects for fabrication by the three-dimensional printers 204 described herein.

One or more web servers 211 may provide web-based access to and from any of the other participants in the environment 200. While depicted as a separate network entity, it will be readily appreciated that a web server 211 may be logically or physically associated with one of the other devices described herein, and may, for example, provide a user interface for web access to one of the three-dimensional printers 204, one of the print servers 208 (or databases 209 coupled thereto), one of the content sources 210, or any of the other resources 216 described below in a manner that permits user interaction through the data network 202, e.g., from a client device 206 or mobile device 212.

The mobile devices 212 may be any form of mobile device, such as any wireless, battery-powered device, that might be used to interact with the networked printing environment 200. The mobile devices 212 may, for example, include laptop computers, tablets, thin client network computers, portable digital assistants, messaging devices, cellular phones, smart phones, portable media or entertainment devices, and so forth. In general, mobile devices 212 may be operated by users for a variety of user-oriented functions such as to locate printable objects, to submit objects for printing, to monitor a personally owned printer, and/or to monitor a pending print job. A mobile device 212 may include location awareness technology such as Global Positioning System ("GPS"), which may obtain information that can be usefully integrated into a printing operation in a variety of ways. For example, a user may select an object for printing and submit a model of the object to a print server, such as any of the print servers described above. The print server may determine a location of the mobile device 212 initiating the print job and locate a closest printer for fabrication of the object.

In another aspect, a printing function may be location-based, using the GPS input (or cellular network triangulation, proximity detection, or any other suitable location detection techniques). For example, a user may be authorized to print a model only when the user is near a location (e.g., within a geo-fenced area or otherwise proximal to a location), or only after a user has visited a location. Thus a user may be provided with printable content based upon locations that the user has visited, or while within a certain venue such as an amusement park, museum, theater, sports arena, hotel, or the like. Similarly, a matrix barcode such as a QR code may be employed for localization.

The other resources 216 may include any other software or hardware resources that may be usefully employed in networked printing applications as contemplated herein. For example, the other resources 216 may include payment processing servers or platforms used to authorize payment for content subscriptions, content purchases, or printing resources. As another example, the other resources 216 may include social networking platforms that may be used, e.g., to share three-dimensional models and/or fabrication results according to a user's social graph. In another aspect, the other resources 216 may include certificate servers or other security resources for third party verification of identity, encryption or decryption of three-dimensional models, and so forth. In another aspect, the other resources 216 may include online tools for three-dimensional design or modeling, as well as databases of objects, surface textures, build supplies, and so forth. In another aspect, the other resources 216 may include a desktop computer or the like co-located (e.g., on the same local area network with, or directly coupled to through a serial or USB cable) with one of the three-dimensional printers 204. In this case, the other resource 216 may provide supplemental functions for the three-dimensional printer 204 in a networked printing context such as maintaining a print queue or operating a web server for remote interaction with the three-dimensional printer 204. Other resources 216 also include supplemental resources such as three-dimensional scanners, cameras, and post-processing/finishing machines or resources. More generally, any resource that might be usefully integrated into a networked printing environment may be one of the resources 216 as contemplated herein.

It will be readily appreciated that the various components of the networked printing environment 200 described above may be arranged and configured to support networked printing in a variety of ways. For example, in one aspect there is disclosed herein a networked computer with a print server and a web interface to support networked three-dimensional printing. This device may include a print server, a database, and a web server as discussed above. The print server may be coupled through a data network to a plurality of three-dimensional printers and configured to receive status information from one or more sensors for each one of the plurality of three-dimensional printers. The print server may be further configured to manage a print queue for each one of the plurality of three-dimensional printers. The database may be coupled in a communicating relationship with the print server and configured to store print queue data and status information for each one of the plurality of three-dimensional printers. The web server may be configured to provide a user interface over the data network to a remote user, the user interface adapted to present the status information and the print queue data for one or more of the plurality of three-dimensional printers to the user and the user interface adapted to receive a print job from the remote user for one of the plurality of three-dimensional printers.

The three-dimensional printer 204 described above may be configured to autonomously subscribe to syndicated content sources and periodically receive and print objects from those sources. Thus in one aspect there is disclosed herein a device including any of the three-dimensional printers described above; a network interface; and a processor (which may without limitation include the controller for the printer). The processor may be configured to subscribe to a plurality of sources of content (such as the content sources 210 described above) selected by a user for fabrication by the three-dimensional printer through the network interface. The processor may be further configured to receive one or more three-dimensional models from the plurality of content sources 210, and to select one of the one or more three-dimensional models for fabrication by the three-dimensional printer 204 according to a user preference for prioritization. The user preference may, for example, preferentially prioritize particular content sources 210, or particular types of content (e.g., tools, games, artwork, upgrade parts, or content related to a particular interest of the user).

The memory of a three-dimensional printer 204 may be configured to store a queue of one or more additional three-dimensional models not selected for immediate fabrication. The processor may be programmed to periodically re-order or otherwise alter the queue according to pre-determined criteria or manual user input. For example, the processor may be configured to evaluate a new three-dimensional model based upon a user preference for prioritization, and to place the new three-dimensional model at a corresponding position in the queue. The processor may also or instead be configured to retrieve content from one of the content sources 210 by providing authorization credentials for the user, which may be stored at the three-dimensional printer or otherwise accessible for presentation to the content source 210. The processor may be configured to retrieve content from at least one of the plurality of content sources 210 by authorizing a payment from the user to a content provider. The processor may be configured to search a second group of sources of content (such as any of the content sources 210 described above) according to one or more search criteria provide by a user. This may also or instead include demographic information for the user, contextual information for the user, or any other implicit or explicit user information.

In another aspect, there is disclosed herein a system for managing subscriptions to three-dimensional content sources such as any of the content sources 210 described above. The system may include a web server configured to provide a user interface over a data network, which user interface is adapted to receive user preferences from a user including a subscription to a plurality of sources of a plurality of three-dimensional models, a prioritization of content from the plurality of sources, and an identification of one or more fabrication resources coupled to the data network and suitable for fabricating objects from the plurality of three-dimensional models. The system may also include a database to store the user preferences, and to receive and store the plurality of three-dimensional models as they are issued by the plurality of sources. The system may include a processor (e.g., of a print server 208, or alternatively of a client device 206 interacting with the print server 208) configured to select one of the plurality of three-dimensional models for fabrication based upon the prioritization. The system may include a print server configured to communicate with the one or more fabrication resources through the data network, to determine an availability of the one or more fabrication resources, and to transmit the selected one of the plurality of three-dimensional models to one of the one or more fabrication resources.

In another aspect, there is disclosed herein a network of three-dimensional printing resources comprising a plurality of three-dimensional printers, each one of the plurality of three-dimensional printers including a network interface; a server configured to manage execution of a plurality of print jobs by the plurality of three-dimensional printers; and a data network that couples the server and the plurality of three-dimensional printers in a communicating relationship.

In general as described above, the server may include a web-based user interface configured for a user to submit a new print job to the server and to monitor progress of the new print job. The web-based user interface may permit video monitoring of each one of the plurality of three-dimensional printers, or otherwise provide information useful to a remote user including image-based, simulation-based, textual-based or other information concerning status of a current print. The web-based user interface may include voice input and/or output for network-based voice control of a printer.

The fabrication resources may, for example, include any of the three-dimensional printers 204 described above. One or more of the fabrication resources may be a private fabrication resource secured with a credential-based access system. The user may provide, as a user preference and prior to use of the private fabrication resource, credentials for accessing the private fabrication resource. In another aspect, the one or more fabrication resources may include a commercial fabrication resource. In this case the user may provide an authorization to pay for use of the commercial fabrication resource in the form of a user preference prior to use of the commercial fabrication resource.

Many current three-dimensional printers require significant manufacturing time to fabricate an object. At the same time, certain printers may include a tool or system to enable multiple, sequential object prints without human supervision or intervention, such as a conveyor belt. In this context, prioritizing content may be particularly important to prevent crowding out of limited fabrication resources with low priority content that arrives periodically for autonomous fabrication. As a significant advantage, the systems and methods described herein permit prioritization using a variety of user-specified criteria, and permit use of multiple fabrication resources in appropriate circumstances. Thus prioritizing content as contemplated herein may include any useful form of prioritization. For example, this may include prioritizing the content according to source. The content sources 210 may have an explicit type that specifies the nature of the source (e.g., commercial or paid content, promotional content, product support content, non-commercial) or the type of content provided (e.g., automotive, consumer electronics, radio control hobbyist, contest prizes, and so forth). Prioritizing content may include prioritizing the content according to this type. The three-dimensional models themselves may also or instead include a type (e.g., tool, game, home, art, jewelry, replacement part, upgrade part, etc.) or any other metadata, and prioritizing the content may include prioritizing the content according to this type and/or metadata.

In one aspect, the processor may be configured to select two or more of the plurality of three-dimensional models for concurrent fabrication by two or more of the plurality of fabrication resources based upon the prioritization when a priority of the two or more of the plurality of three-dimensional models exceeds a predetermined threshold. That is, where particular models individually have a priority above the predetermined threshold, multiple fabrication resources may be located and employed to fabricate these models concurrently. The predetermined threshold may be evaluated for each model individually, or for all of the models collectively such as on an aggregate or average basis.

In one aspect, the processor may be configured to adjust prioritization based upon a history of fabrication when a number of objects fabricated from one of the plurality of sources exceeds a predetermined threshold. Thus, for example, a user may limit the number of objects fabricated from a particular source, giving subsequent priority to content from other sources regardless of an objectively determined priority for a new object from the particular source. This prevents a single source from overwhelming a single fabrication resource, such as a personal three-dimensional printer operated by the user, in a manner that crowds out other content from other sources of possible interest. At the same time, this may enable content sources 210 to publish on any convenient schedule, without regard to whether and how subscribers will be able to fabricate objects.

In another aspect, the processor may be configured to identify one or more additional sources of content based upon a similarity to one of the plurality of sources of content. For example, where a content source 210 is an automotive manufacturer, the processor may perform a search for other automotive manufactures, related parts suppliers, mechanics, and so forth. The processor may also or instead be configured to identify one or more additional sources of content based upon a social graph of the user. This may, for example, include analyzing a social graph of relationships from the user to identify groups with common interests, shared professions, a shared history of schools or places of employment, or a common current or previous residence location, any of which may be used to locate other sources of content that may be of interest to the user.

Figure 3:
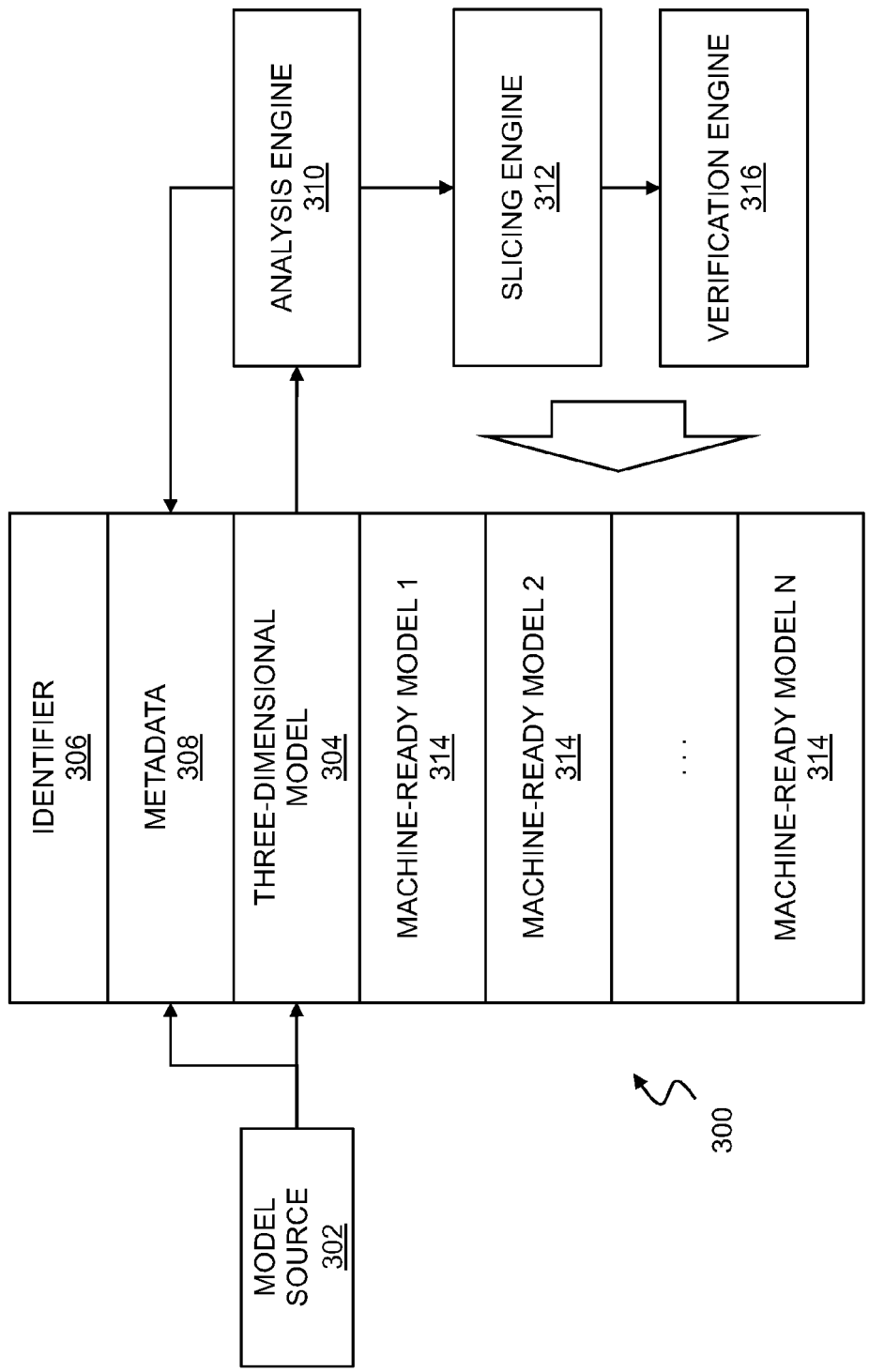
FIG. 3 shows a data structure for storing machine-ready models of three-dimensional objects.

FIG. 3 shows a data structure for use with machine-ready models. In general, the server described above may be adapted to provide convenient user access to machine-ready models for fabrication, such as by providing one-click downloading or printing of remotely stored, printable content. In order to facilitate these user interactions, three-dimensional models may be processed in a manner that permits convenient retrieval of relevant data on a user-by-user or printer-by-printer basis.

In general, a model source 302 such as a user may provide a three-dimensional model 304 of an object, for example over a network to a server such as any of the servers described above. The model source 302 may also or instead include a digital scanner or other device that automatically forwards models to the server. In general, the three-dimensional model 304 may be any suitable digital representation of a three-dimensional shape, such as a computer-automated design (CAD) model, a stereolithography (STL) file, a 3DS file, a DEM file, a COLLADA file, or any other such file. The server may store the three-dimensional digital model 304 in a database such as any of the databases described above.

The data structure 300 may include an identifier 306 such as a title or unique numerical identifier, e.g., for purposes of location, identification, or indexing in a database. The identifier 306 may be automatically created for the three-dimensional model 304 when it is received by the server.

The data structure 300 may include metadata 306 such as any descriptive information for the object that is characterized by the digital three-dimensional model 304. For example, the metadata 306 may include information provided by the model source 302 such as a title, author, creation date, propriety rights management information, descriptive text, and so forth. Where the model source 302 is an automated model source such as a three-dimensional scanner, the metadata 306 may also or instead identify a scanner time, time and date of a scan, scanning parameters (where applicable), scanner location, and so forth. Metadata 306 may also or instead be provided from other sources. For example, the server (or some other remote resource) may track downloads and prints of an object, and may log this information in the metadata 304 as usage statistics covering, e.g., number of downloads, popularity, build results, and so forth. Thus in general the metadata 306 may include descriptive data from any of a variety of sources such as a computer rendering of an object, a photograph of an object, an author comment for an object, a number of downloads for an object (or a specific machine-ready model of the object), a category tag for an object, or a popularity rating for an object. Where the metadata 306 includes the number of downloads for the object, the number of downloads may be further subcategorized to include a number of downloads for each one of the machine-ready models for the object.

The server may include an analysis engine 310 that processes a three-dimensional model 304 when it is received by the server. This may, for example, include processing the model 304 and metadata 308 from the user to create additional metadata 308 concerning the model 304. For example, the analysis engine 310 may generate useful metadata concerning the size, printability, build material requirements, and so forth for the object based upon any suitable set of rules and populate the metadata 308 with results. Similarly, the analysis engine 310 may create a snapshot or other rendering of the object (based upon the model 304) that may be stored in the metadata 308 for use, e.g., in a user interface when browsing models in a database for the data structure 300.

The server may include a slicing engine 312 that prepares machine-ready models 314 of the object that is described by the three-dimensional model 304. This may, for example be g-code, which is commonly used for three-dimensional printers, or any other suitable printer-executable description of the object based upon the three-dimensional model 304. It will be understood that a variety of different three-dimensional printers are commercially available. Thus, the machine-ready models 314 may include models for different manufacturers of three-dimensional printers, and/or for different models of printers from a single manufacturer.

This may include models for different printing technologies. For example, the types of three-dimensional printers covered by the machine-ready models 314 may include printers using any number of printing technologies such as jet printing, stereolithography, fused deposition modeling, layered object manufacturing, and selective laser sintering. Each such printing technology generally uses a different underlying technique for fabricating three-dimensional objects, thus requiring sometimes very different machine-ready models.

Additionally, certain printers may have optional features useful in printing such as a heated build platform or a conveyor or the like to remove objects from a build volume. These may be provided as options from a commercial manufacturer, or these may be custom-made by end users. Thus the configuration for a three-dimensional printer may include one or more hardware components such as a display, a heated build platform, a camera, a conveyor or a color-mixing system. Each printer may thus nominally have different slicing rules for creating a machine-ready model 314, and the slicing engine 312 may produce any number of corresponding machine-ready models 314 for an object.

In one aspect, this may include machine-ready models 314 that are required for different printers that do not have interoperable machine coding, that is, for which a machine-ready model on one printer will not render properly on another printer. In another aspect, this may include machine-ready models 314 that accommodate a variety of possible user preferences concerning, e.g., print resolution, size, infilling density, rafting or support structures, and so forth. This may also or instead include machine-ready models 314 for various optional printer features such as build volume temperature control, a heated build platform, a conveyor to remove objects from a build volume, and so forth. As another example, where a three-dimensional printer has a camera or the like, a corresponding machine-ready model 314 may enable the camera for remote viewing during a build. As another example, a printer may have color-mixing capabilities or an ability to select among various, different build materials either at the beginning of a build or during a build. These types of variations may in general be accommodated among the machine-ready models 314 at any desired level of granularity according to, e.g., the data storage and processing capabilities of the database and server being used.

A verification engine 316 may also be included to verify the suitability of machine-ready models 314 for fabrication on an intended device. This may, for example, include computer-based verification such as a rules-based verification of compliance with any number of build rules covering, e.g., overhangs, support, size, and so forth. In another aspect, a machine-ready model may be manually verified by fabricating the model with a printer and having a user confirm that the build is successful. In one aspect, this manual verification may be performed selectively, e.g., for popular printer types, and each machine-ready model 314 may be annotated in the metadata 308 or within the model 314 to indicate whether it has been successfully fabricated.

Figure 4:
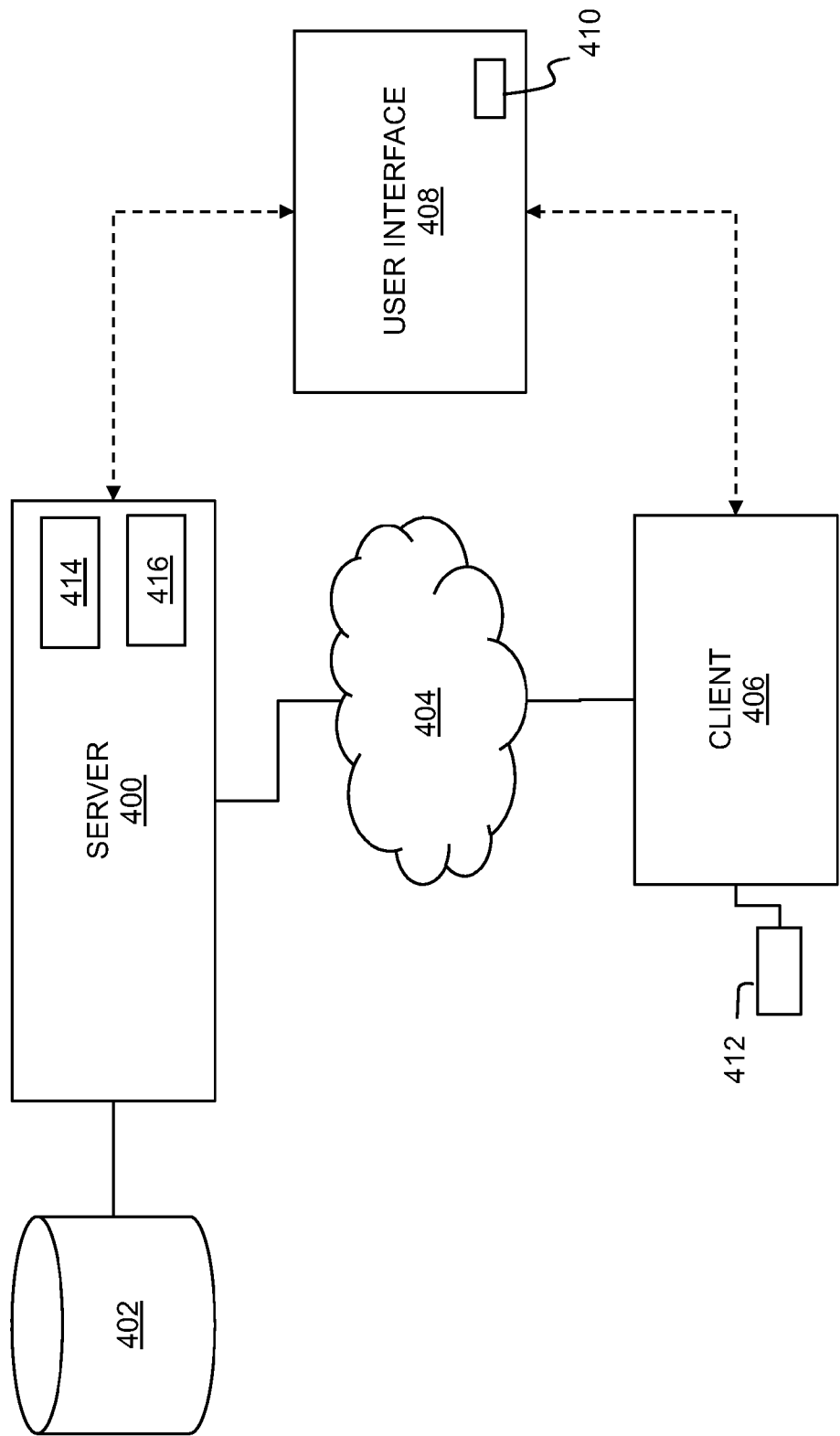
FIG. 4 shows a server configured to provide machine-ready models of three-dimensional objects.

FIG. 4 shows a server configured to provide machine-ready models of three-dimensional objects. The server 400 may include a database 402 that stores a data structure such as the data structure 300 described with reference to FIG. 3 for a number of machine-ready models adapted for one of a number of types of three-dimensional printers each having a predetermined configuration. The server 400 may be coupled to the database and coupled in a communicating relationship with a data network 404. The server 400 may be configured to respond to a request from a client 406 for the object by selecting one of the machine-ready models corresponding to a three-dimensional printer associated with the client and transmitting the one of the machine-ready models to the client 406. The client 406 may be a three-dimensional printer with network capabilities, or the client 406 may be another computing device such as a desktop computer, laptop computer, or tablet locally coupled to the three-dimensional printer.

The server 400 may be a web server that is configured to select and transmit a machine-ready model in response to a single action from the client 406. In general, the server may provide a user interface 408 for browsing among objects stored in the database. The single-action response may be realized, e.g., with a control 410 such as a button in the user interface 408 that permits a user with a single mouse click or other action to download a model, or to send the model directly to a three-dimensional printer. A confirmation step may optionally be included, which may be viewed as a confirmation of the single-click operation or as a second step in a user-initiated download or print. In order to facilitate a single-action response in this manner, the server 400 may detect a type of three-dimensional printer associated with the client 406 in any of a number of ways. For example, if the client 406 is a three-dimensional printer, the client 406 may self-identify a type from local version information. Similarly, if the client 406 is a desktop computer or other computing device locally coupled to the three-dimensional printer, the client 406 may retrieve type information from the three-dimensional printer and provide this information to the server. In another aspect, a user of the client 406 may manually identify a type of three-dimensional printer and/or specific capabilities of the three-dimensional printer. Similarly, if the server 400 is unable to determine a type of three-dimensional printer for the client 406, the server 400 may specifically request this information in the user interface 408.

In another aspect, the client 406 may interact with the server 400 in an authenticated session where a user of the client provides login information. The server 400 may store an association of the user with a particular printer or type of printer, and the server 400 may use this server-side data to determine an association of the user or the client 406 with a particular type of three-dimensional printer for the purposes of selecting a machine-ready model responsive to the user action. Where a client 406 selects a machine-ready model for download, the client 406 may be configured to automatically store the machine-ready model on a removable memory device 412 locally coupled to the client, such as a USB drive or memory stick.

As described above, the server 400 may be configured to receive a digital model of an object through the data network, and to create a number of machine-ready models for storage in the database 402. The database 402 may store any number of machine-ready models for any number of objects, and the server 400 may provide the user interface 408, e.g., in a web browser, for browsing or searching objects and selecting an object (or a specific machine-ready model) for download.

In one aspect, the server 400 and database 402 may use a one-to-one mapping of machine-ready models to printer types so that a single model is deterministically selected for a three-dimensional printer. In this case, where no corresponding machine-ready model is available for the specific type of three-dimensional printer, the request from the client 406 for a download or print may be denied by the server 400. In another aspect, the server 400 may include a selection engine 416 for more nuanced selections of suitable models. For example, when two or more of the machine-ready models are suitable for the three-dimensional printer associated with the client 406, the selection engine 416 may select one of the two or more machine-ready models in the database 402 according to a predetermined criterion and transmit the one of the two or more machine-ready models to the client. This may be a criterion based on machine capabilities. For example, if a three-dimensional printer can interpret and execute g-code, the selection engine 416 may select one or more models represented in g-code. Similarly, if a three-dimensional printer uses a certain type of build material (e.g., PLA or ABS), this may impose practical limits on aspects of a model such as where support structures are needed for overhangs or whether a raft or other substrate should be printed. As such, the selection engine 416 may select one or more models most suited to that type of build material. This may also or instead include a user-based criterion such as print resolution, minimum feature sizes, and so forth.

The server may include a modification engine 414 configured to modify a selected one of the machine-ready models according to specific configuration information for the three-dimensional printer associated with the client 406. The modification engine 414 may in general be used to modify a pre-existing machine-ready model in the database 402 as an alternative to storing multiple machine-ready models with minor variations. For example, if the three-dimensional printer includes a conveyor or other hardware to automatically remove a completed object from a build volume, the modification engine 414 may add corresponding instructions to the machine-ready code delivered to the client 406 for execution on the three-dimensional printer. Similarly, if the three-dimensional printer has multi-color printing capability and the model includes multi-color information (such as a texture map of surface colors), the modification engine 414 may include suitable color change instructions in the machine-ready code. This may also include software-enabled features such as firmware upgrades or the like, and the server 400 may detect such software-enabled features and where appropriate make modifications to the machine-ready code with the modification engine 414. While certain capabilities or features may require an entirely different machine-ready model, other features may be accommodated with the simple addition or removal of a few lines of machine-ready code. In the latter context, the modification engine 414 may usefully reduce the number of machine-ready models required for a wide range of printer configurations and capabilities.

In one aspect, the server 400 may be configured to automatically determine when a request to fabricate a machine-ready model should be redirected to a second three-dimensional printer. For example, the control 410 of the user interface may include a "print now" button or the like that automatically transmits a machine-ready model to the client 406 for immediate fabrication. If the three-dimensional printer associated with the client 406 is unavailable or is providing an error message or the like, the server 400 may detect this and select another three-dimensional printer to immediately fabricate the machine-ready model. However, the machine-ready model selected for the client 406 may be unsuitable for this second three-dimensional printer, so the server 400 may repeat the process of selecting an appropriate machine-ready model for the second three-dimensional printer. The server 400 may be configured to perform other related functions such as managing a print queue for the three-dimensional printer and the second three-dimensional printer, or more generally managing a print queue for the client 406.

Figure 5:
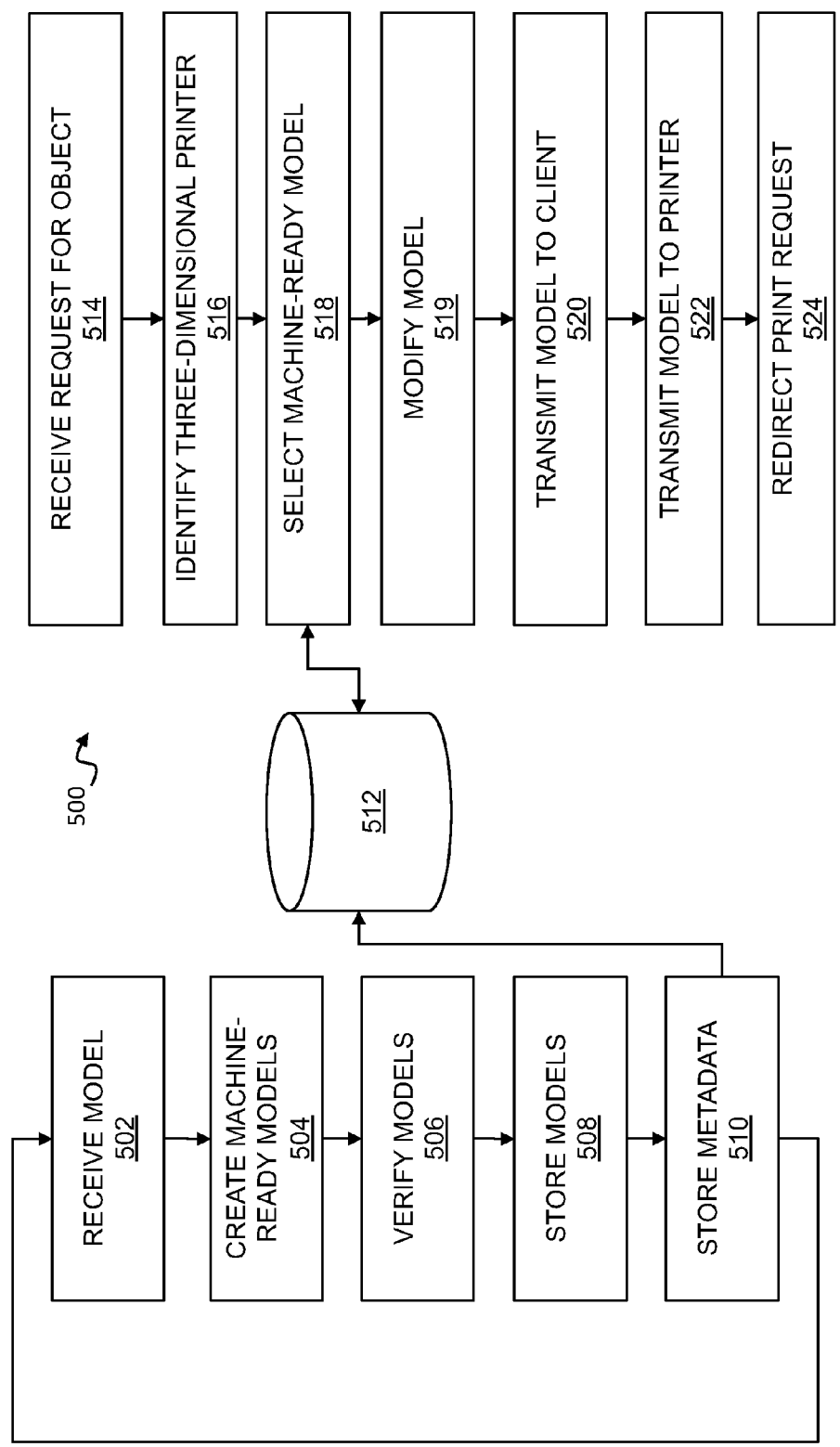
FIG. 5 shows a flow chart for providing machine-ready models of three-dimensional objects.

FIG. 5 shows a method for providing machine-ready models of three-dimensional objects.

As shown in step 502, the method 500 may include receiving a digital model of an object through a data network.

As shown in step 504, the method 500 may include creating a plurality of machine-ready models based upon the digital model. This may include machine-ready models for a variety of types of three-dimensional printers and/or hardware configurations as discussed above. The types of three-dimensional printers may include different printers from a single manufacturer, or printers from different manufacturers. The types of three-dimensional printers may also or instead include printers using various printing technologies such as jet printing, stereolithography, fused deposition modeling, layered object manufacturing, and selective laser sintering. A predetermined configuration for one of the types of three-dimensional printers may also include one or more hardware components of the three-dimensional printer such as a display, a heated build platform, a camera, a conveyor, a color-mixer, or other optional hardware component, any of which may require specialized machine code for use in fabricating a model. In general the number of machine-ready models may be any number of machine-ready models according to the number and type of printers desired to be covered, the storage or processing capabilities of the system, the degree of granularity desired for varying hardware configurations, or any other factors.

As shown in step 506, the method 500 may include verifying a printability of each one of the machine-ready models on a corresponding one of the types of three-dimensional printers. As described above, this may include manual verification by attempting fabrication on each corresponding type of three-dimensional printer, or this may include automated verification using a rules-based verification process or any other suitable technique(s).

As shown in step 508, the method 500 may include storing the machine-ready models of the object in a database 512, were each one of the machine-ready models is adapted for a type of three-dimensional printer having a predetermined configuration.

As shown in step 510, the method 500 may include storing metadata for the object that is the subject of the models. This may include metadata received from a source of the underlying three-dimensional model or metadata created by a server or the like that receives the three-dimensional model. The metadata may include a computer rendering of the object, a photograph of the object, an author comment for the object, a number of downloads or prints for the object, a category tag for the object, and a popularity rating for the object. Where the metadata includes a number of downloads or prints, this may be further sub-categorized to include the number of downloads or prints for each one of the machine-ready models for the object.

The above steps may be repeated for any number of times for any number of objects to create the database 512. It will be understood that the method may be performed in parallel for any number of simultaneous users, and that steps such as creating individual machine-ready models may be readily parallelized for greater performance. Other steps such verifying models and creating/storing metadata may be performed in any order or with any priority suitable to anticipated use of the system.

Once the database 512 has been populated with machine-ready models, the database 512 may be provided as a web-accessible resource for remote clients to retrieve machine-ready models for specific three-dimensional printers.

As shown in step 514, the method 500 may include receiving a request from a client for an object through a data network. It will be understood that the term "object" as used herein is intended to refer to a three-dimensional object characterized by a three-dimensional model. For the purposes of this disclosure it does not matter whether the client request is for the object (e.g. "lamp") or for a machine-ready model that may be used to fabricate the object, as either request will be transferred to a server or similar resource in a machine-readable form that can result in the appropriate model being returned to the client. Thus these terms are in a certain sense interchangeable, unless a more specific meaning is explicitly provided or otherwise clear from the context, such as where a client makes a request for a specific one of a number of machine-ready models.

The request from the client may include a single action from the client in a web page served by a web server to the client, such as a single mouse click of a button or other similar action. As noted above, receiving a request from a client may include providing a user interface through a data network for the client to browse a plurality of objects and to select one of the plurality of objects for fabrication.

As shown in step 516, the method 500 may include identifying a three-dimensional printer associated with the client. This may be based on information passed to the server in a client request, such as information obtained from a memory of the client, information obtained from a memory of an associated three-dimensional printer, or information manually provided by a user at the client. This may also or instead include information retrieved by the server based upon an identity of the user or the client.

As shown in step 518, the method 500 may include selecting one of the machine-ready models corresponding to the three-dimensional printer associated with the client. The corresponding model may be located in and retrieved from the database 512. When two or more of the machine-ready models are suitable for the three-dimensional printer associated with the client, this may further include selecting one machine-ready models according to a predetermined criterion, such as with the selection engine described above.

As shown in step 519, the method may include modifying a selected machine-ready model according to specific configuration information for the three-dimensional printer associated with the client. This may, for example, include any of the modification techniques described above with reference to the modification engine of FIG. 4.

As shown in step 520, the method 500 may include transmitting the selected machine-ready model to the client through the data network. In one aspect, the client may be a network-enabled three-dimensional printer that serves as a client device to directly receive machine-ready models for fabrication. In another aspect, the client may be a computing device such as a desktop, laptop or tablet locally coupled in a communicating relationship with the three-dimensional printer.

As shown in step 522, the method 500 may include transmitting the machine-ready model from the client to the three-dimensional printer for fabrication. The client may also be configured to automatically store the machine-ready model on a removable device such as a USB drive or memory stick locally coupled to the client. In one aspect the user interface provided by the server may include an option to download (e.g., to the removable memory device) and an option to print (e.g., to a locally attached three-dimensional printer).

As shown in step 524, the method 500 may include redirecting a print request. This optional step may be used, for example, when a model is transmitted directly to a printer as a request for fabrication, that is, as a print instruction or the like. The server may automatically determine when the request should be redirected, such as when the three-dimensional printer is unavailable or when some other print failure or other print error is detected. In this case, redirecting the print may include performing a supplemental selection of a suitable machine-ready model based upon information for a second three-dimensional printer that is the target of a redirection of the print request.

The methods or processes described above, and steps thereof, may be realized in hardware, software, or any combination of these suitable for a particular application. The hardware may include a general-purpose computer and/or dedicated computing device. The processes may be realized in one or more microprocessors, microcontrollers, embedded microcontrollers, programmable digital signal processors, or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as computer executable code created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, means for performing the steps associated with the processes described above may include any of the hardware and/or software described above. All such permutations and combinations are intended to fall within the scope of the present disclosure.

It should further be appreciated that the methods above are provided by way of example. Absent an explicit indication to the contrary, the disclosed steps may be modified, supplemented, omitted, and/or re-ordered without departing from the scope of this disclosure.

The method steps of the invention(s) described herein are intended to include any suitable method of causing such method steps to be performed, consistent with the patentability of the following claims, unless a different meaning is expressly provided or otherwise clear from the context. So for example performing the step of X includes any suitable method for causing another party such as a remote user or a remote processing resource (e.g., a server or cloud computer) to perform the step of X. Similarly, performing steps X, Y and Z may include any method of directing or controlling any combination of such other individuals or resources to perform steps X, Y and Z to obtain the benefit of such steps.

While particular embodiments of the present invention have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law.

What is claimed is:

1. A method comprising:
   creating a plurality of different machine-ready models of an object from a three-dimensional model of the object, each one of the plurality of different machine-ready models adapted for fabricating the object characterized by the three-dimensional model on one of a number of different types of three-dimensional printers each having a predetermined configuration resulting in different slicing rules for converting the three-dimensional model into a corresponding one of the machine-ready models;
   storing the plurality of different machine-ready models of the object;
   receiving a request from a client for the object through a data network;
   identifying a type of three-dimensional printer locally associated with the client;
   selecting a machine-ready model from the plurality of different machine-ready models of the object, wherein the machine-ready model is selected as corresponding to the type of three-dimensional printer locally associated with the client; and
   transmitting the machine-ready model to the client through the data network.

2. The method of claim 1 wherein the request from the client includes a single action from the client in a web page served by a web server to the client.

3. The method of claim 2 further comprising receiving the machine-ready model at the client and transmitting the machine-ready model from the client to the three-dimensional printer for fabrication.

4. The method of claim 2 wherein the client is configured to automatically store the machine-ready model on a removable memory device locally coupled to the client.

5. The method of claim 2 wherein the single action is a single mouse click from the client.

6. The method of claim 1 wherein the plurality of different machine-ready models include g-code for fabricating the object.

7. The method of claim 1 further comprising receiving the three-dimensional model of the object through the data network.

8. The method of claim 1 further comprising storing a second plurality of machine-ready models for each of a plurality of objects.

9. The method of claim 8 further comprising providing a user interface through the data network for the client to browse the plurality of objects and select one of the plurality of objects for fabrication.

10. The method of claim 1 further comprising verifying a printability of each one of the plurality of different machine-ready models on a corresponding one of the different types of three-dimensional printers.

11. The method of claim 1 further comprising storing metadata for the object, the metadata including one or more of a computer rendering of the object, a photograph of the object, an author comment for the object, a number of downloads for the object, a category tag for the object, and a popularity rating for the object.

12. The method of claim 1 further comprising modifying a selected one of the plurality of different machine-ready models according to specific configuration information for the three-dimensional printer associated with the client.

13. The method of claim 1 further comprising:
   automatically determining when a request to fabricate a selected one of the plurality of different machine-ready models should be redirected to a second three-dimensional printer; and
   performing a second selection of one of the plurality of different machine-ready models corresponding to the second three-dimensional printer.

14. The method of claim 13 further comprising managing a print queue for one or more of the client, the three-dimensional printer, and the second three-dimensional printer.

15. The method of claim 1 wherein the different types of three-dimensional printers include different printers from a single manufacturer.

16. The method of claim 1 wherein the different types of three-dimensional printers include printers using two or more printing technologies selected from a group including jet printing, stereolithography, fused deposition modeling, layered object manufacturing, and selective laser sintering.

17. The method of claim 1 wherein the predetermined configuration includes one or more hardware components of the three-dimensional printer.

18. The method of claim 1 further comprising, when two or more of the plurality of different machine-ready models are suitable for the three-dimensional printer associated with the client, selecting one of the two or more machine-ready models according to a predetermined criterion and transmitting the one of the two or more machine-ready models to the client.

19. A computer program product comprising computer-executable code embodied in a non-transitory computer readable medium that, when executing on one or more computing devices, performs the steps of:
   creating a plurality of different machine-ready models of an object from a three-dimensional model of the object, each one of the plurality of different machine-ready models adapted for fabricating the object characterized by the three-dimensional model on one of a number of different types of three-dimensional printers each having a predetermined configuration resulting in different slicing rules for converting the three-dimensional model into a corresponding one of the machine-ready models;
   storing the plurality of different machine-ready models of the object;
   receiving a request from a client for the object through a data network;

identifying a type of three-dimensional printer locally associated with the client;

selecting a machine-ready model from the plurality of different machine-ready models of the object, wherein the machine-ready model is selected as corresponding to the type of three-dimensional printer locally associated with the client; and transmitting the machine-ready model to the client through the data network.

* * * * *